United States Patent
Hayase (10) Patent No.: US 11,336,188 B2
(45) Date of Patent: May 17, 2022

(54) POWER CONVERSION CIRCUIT

(71) Applicant: Mitsubishi Electric Corporation, Tokyo (JP)

(72) Inventor: Kei Hayase, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 148 days.

(21) Appl. No.: 16/639,978

(22) PCT Filed: Apr. 10, 2018

(86) PCT No.: PCT/JP2018/015097
§ 371 (c)(1),
(2) Date: Feb. 18, 2020

(87) PCT Pub. No.: WO2019/069489
PCT Pub. Date: Apr. 11, 2019

(65) Prior Publication Data
US 2021/0376740 A1    Dec. 2, 2021

(30) Foreign Application Priority Data

Oct. 3, 2017 (JP) .............................. JP2017-193583

(51) Int. Cl.
*H02M 1/088* (2006.01)
*H02M 3/335* (2006.01)
(Continued)

(52) U.S. Cl.
CPC ..... *H02M 3/33571* (2021.05); *H02M 1/0006* (2021.05); *H02M 1/0048* (2021.05); *H02M 1/096* (2013.01)

(58) Field of Classification Search
CPC ......... H02M 1/33569; H02M 3/33573; H02M 3/33571; H02M 1/0006; H02M 1/0048; H02M 1/096; H02M 1/088
See application file for complete search history.

(56) References Cited

U.S. PATENT DOCUMENTS

2004/0120090 A1    6/2004 Galli et al.
2009/0174353 A1    7/2009 Nakamura et al.
(Continued)

FOREIGN PATENT DOCUMENTS

JP    2009-130967 A    6/2009
JP    2013-208017 A    10/2013
(Continued)

OTHER PUBLICATIONS

Internal Search Report for PCT/JP2018/015097 dated Jul. 3, 2018 [PCT/ISA/210].
(Continued)

*Primary Examiner* — Adolf D Berhane
(74) *Attorney, Agent, or Firm* — Sughrue Mion, PLLC; Richard C. Turner (57) ABSTRACT

Provided is a power conversion circuit for achieving a power conversion device capable of suppressing charging/discharging of a parasitic capacitor caused by high-frequency switching, and of reducing a loss of a semiconductor switching element. The power conversion circuit includes: a circuit board including a plurality of layers including two or more layers, on which circuit patterns are formed; and a plurality of semiconductor switching elements connected to the circuit patterns of the circuit board, and configured to perform switching for power conversion. In the circuit board, a plurality of control ground patterns for different nodes, which are configured to drive the plurality of semiconductor switching elements, are arranged so as not to overlap one another in plan view.

10 Claims, 11 Drawing Sheets

(51) Int. Cl.
    *H02M 1/00*     (2006.01)
    *H02M 1/096*    (2006.01)

(56)     References Cited

U.S. PATENT DOCUMENTS

2012/0038411  A1      2/2012   Sugiura et al.
2015/0222262  A1      8/2015   Hanamura et al.
2016/0027570  A1*     1/2016   Sakamoto ........... H01F 27/2804
                                                              336/200
2017/0279360  A1      9/2017   Mutsuura
2017/0353096  A1     12/2017   Kawaguchi
2018/0054136  A1      2/2018   Jimichi et al.
2020/0373852  A1*    11/2020   Xu ..................... H03K 17/0828
2021/0327781  A1*    10/2021   Isozaki ................. H01L 25/072

FOREIGN PATENT DOCUMENTS

JP       2015-154591  A        8/2015
JP       2015-171237  A        9/2015
WO       2016/088211  A1       6/2016
WO       2016/152366  A1       9/2016

OTHER PUBLICATIONS

Written Opinion for PCT/JP2018/015097 dated Jul. 3, 2018 [PCT/ISA/237].
Notice of Reasons for Refusal for 2017-193583 dated Jun. 22, 2018.
European Search Report dated Sep. 28, 2020 issued in Application No. 18864523.8.

* cited by examiner

POWER CONVERSION CIRCUIT

CROSS REFERENCE TO RELATED APPLICATIONS

This application is a National Stage of Application No. PCT/JP2018/015097 filed Apr. 10, 2018, claiming priority based on Japanese Patent Application No. 2017-193583 filed Oct. 3, 2017.

TECHNICAL FIELD

The present invention relates to a power conversion circuit for a power conversion device including a plurality of semiconductor switching elements, and more particularly, to a configuration of each of circuit board patterns for isolated circuits configured to drive the semiconductor switching elements.

BACKGROUND ART

Power conversion devices often adopt a circuit of a half-bridge configuration, in which semiconductor switching elements are connected to each other in series. Drive circuits for the series-connected semiconductor switching elements are required to have different GNDs (reference potentials), and are achieved by, for example, isolated power supply circuits. In particular, in some uses that involve the application of several hundreds of volts, the respective circuits are required to be isolated from a housing, and a GND different from that of the housing is required as a GND for a semiconductor switching element of a lower arm in the half-bridge configuration. In a full-bridge configuration having two half-bridge configurations, a common GND can be used for semiconductor switching elements of lower arms of the two half-bridge configurations. However, different GNDs are required for semiconductor switching elements of upper arms thereof, with the result that the requisite number of GNDs for different nodes increases (see, for example, Patent Literature 1 and Patent Literature 2).

In Patent Literature 1, an inverter circuit has three half-bridge configurations including three upper-arm semiconductor switching elements, and three lower-arm semiconductor switching elements. Further, in Patent Literature 1, GNDs and power supplies for four different nodes in total are provided in the form of being isolated by optical means.

Likewise, in Patent Literature 2, three half-bridge configurations are provided. Further, in Patent Literature 2, a bootstrapping configuration is employed for one of the half-bridge configurations of three inverter circuits, and hence a common power supply is used for driving circuits for semiconductor switching elements of upper and lower arms thereof. In other words, in the configuration of Patent Literature 2, it is required to provide GNDs for every different node, and the inverter circuits are required to have GNDs for four different nodes in total.

CITATION LIST

Patent Literature

[PTL 1] JP 2013-208017 A
[PTL 2] JP 2015-171237 A

SUMMARY OF INVENTION

Technical Problem

However, the related art has the following problems.

In general, a GND is formed with use of a solid pattern. The solid pattern is obtained by filling a large area. Thus, when there are a plurality of GNDs for different nodes, those GNDs for different nodes overlap one another in plan view, that is, as viewed from a direction orthogonal to a circuit board surface in many cases. Now, a consideration is made of a case of using a semiconductor switching element made of gallium nitride (GaN) or silicon carbide (SiC) having a wide bandgap. In this case, the wide-bandgap semiconductor has a feature of being capable of high-speed operation, and thus enables high-frequency switching. With this configuration, a power conversion device can be made compact by downsizing respective peripheral passive components.

However, when a plurality of GNDs for different nodes overlap one another in plan view, parasitic capacitors are formed therebetween. For example, in a case where a GND used for driving a semiconductor switching element of a lower arm and a GND used for driving a semiconductor switching element of an upper arm in the half-bridge circuit overlap each other in plan view, a voltage between the GNDs overlapping in plan view varies depending on a switching period, and hence a parasitic capacitor therebetween is charged/discharged. In this case, charges are accumulated/released via any semiconductor switching element in an ON state, resulting in a problem of increasing a loss of the semiconductor switching element.

Further, the semiconductor switching element having a wide bandgap achieves a high switching speed. This leads to a higher charging/discharging speed in parasitic capacitors between the plurality of GNDs for different nodes. Due to an influence of an electric current flowing during charging/discharging of each parasitic capacitor, a voltage drop occurs in a parasitic inductance portion of a GND wiring between a driver and a corresponding semiconductor switching element. This causes a problem that noise is superimposed on a gate of the semiconductor switching element, and the operation thereof becomes unstable.

The present invention has been made to solve the problems described above, and an object of the present invention is generally to obtain a power conversion circuit for achieving a power conversion device capable of suppressing charging/discharging of a parasitic capacitor caused by high-frequency switching, and of reducing a loss of a semiconductor switching element that is not limited to a wide-bandgap semiconductor switching element.

Solution to Problem

According to one embodiment of the present invention, there is provided a power conversion circuit including: a circuit board including a plurality of layers including two or more layers, on which circuit patterns are formed; and a plurality of semiconductor switching elements connected to the circuit patterns of the circuit board, and configured to perform switching for power conversion. In the circuit board, a plurality of control ground patterns for different nodes, which are configured to drive the plurality of semiconductor switching elements, are arranged so as not to overlap one another in plan view.

Advantageous Effects of Invention

According to the one embodiment of the present invention, the circuit patterns for the plurality of GNDs for different nodes used to drive the semiconductor switching elements are arranged so as not to overlap one another in plan view. With this configuration, it is possible to reduce the parasitic capacitors between the GNDs for different nodes, and thus to reduce a loss of each semiconductor switching element during high-frequency switching.

DESCRIPTION OF EMBODIMENTS

Now, a power conversion circuit for a power conversion device according to each of embodiments of the present invention is described with reference to the drawings. In each of the embodiments, the same or corresponding portions are denoted by the same reference symbols, and the overlapping description thereof is omitted.

First Embodiment

Figure 1:
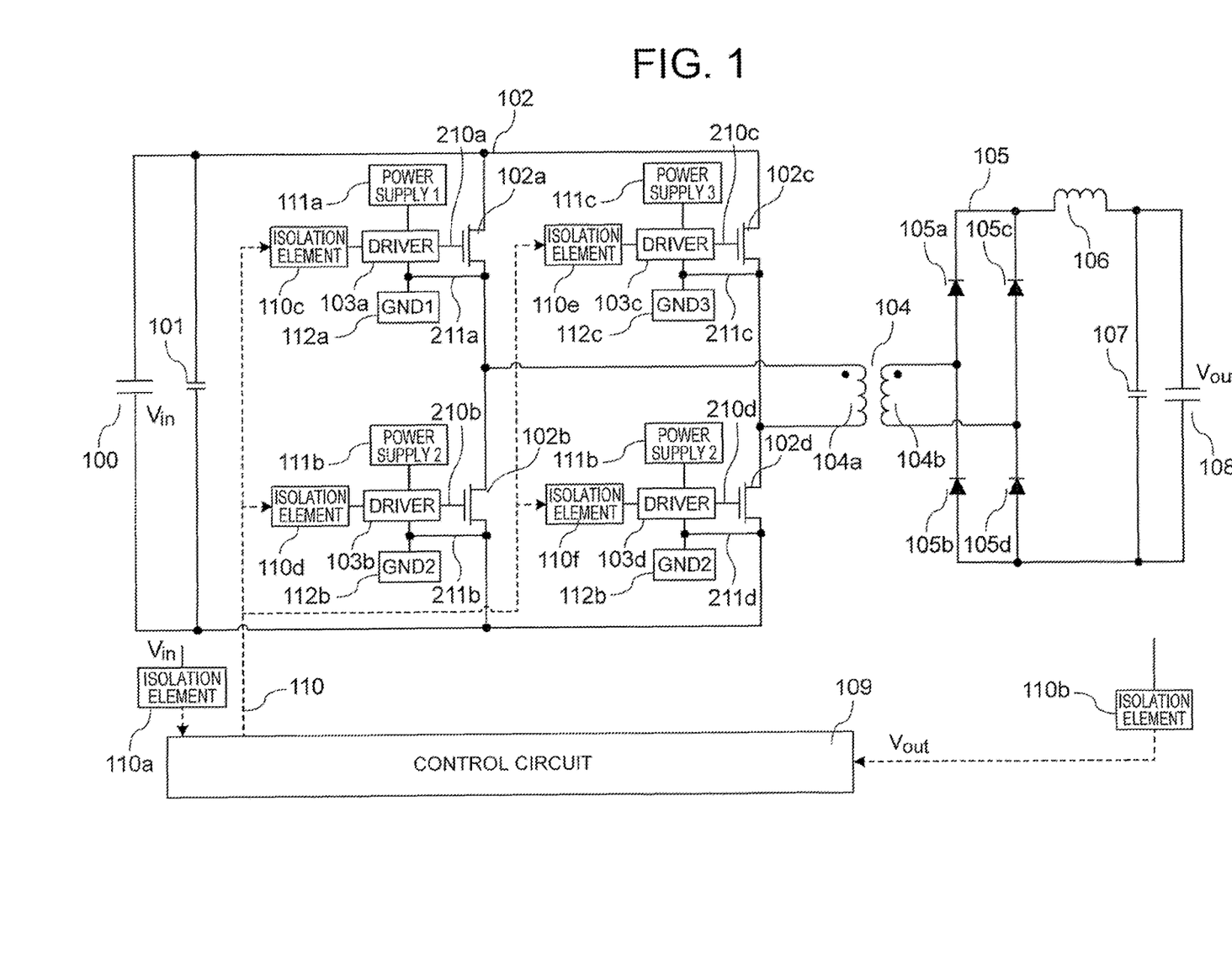
FIG. 1 is a circuit diagram for illustrating an example of a power conversion device including a power conversion circuit according to a first embodiment of the present invention.

FIG. 1 is a circuit diagram for illustrating an example of a power conversion device including a power conversion circuit according to a first embodiment of the present invention. Referring to FIG. 1, a description is given of a circuit board pattern having a plurality of control GNDs (control reference potentials) for different nodes used to drive semiconductor switching elements. In the following, the ground may also be referred to as "GND".

The illustrated example of the power conversion device of FIG. 1 is an isolated full-bridge DC/DC converter, which includes a single-phase inverter 102 as a power converter, a rectifier circuit 105, and a transformer 104 configured to connect the single-phase inverter 102 and the rectifier circuit 105 to each other in an electrically isolated manner.

The single-phase inverter 102 is an inverter connected in parallel to an input power supply 100 and an input capacitor 101, and is configured to convert a DC voltage Vin of the input capacitor 101 to an AC voltage. The single-phase inverter 102 has a full-bridge configuration including four semiconductor switching elements 102a to 102d (hereinafter simply referred to as "semiconductor switching elements") made of gallium nitride (GaN) having a reverse conduction characteristic in a source-drain direction. An output of the full-bridge single-phase inverter 102 is connected to a primary winding 104a of the transformer 104.

The rectifier circuit 105 is connected to a secondary winding 104b of the transformer 104. Further, the rectifier circuit 105 has a full-bridge configuration including four diodes 105a to 105d as rectifier elements (semiconductor elements). The rectifier circuit 105 is series-connected, on its output side, to an output-smoothing reactor 106. The rectifier circuit 105 is also connected in parallel to an output capacitor 107. Further, a DC voltage across the output capacitor 107 is output as a DC voltage Vout to a load 108.

Further, a control circuit 109 is provided outside a main circuit while being isolated therefrom. The input voltage Vin and the output voltage Vout are input to the control circuit 109 via isolation elements 110a and 110b, respectively, and are each monitored by the control circuit 109. The control circuit 109 outputs gate signals 110 to the semiconductor switching elements 102a to 102d so as to obtain a target output voltage Vout, and thus controls on-duty (on period) of each of the semiconductor switching elements 102a to 102d. Drivers 103a to 103d are connected to the semiconductor switching elements 102a to 102d, respectively, to drive the semiconductor switching elements 102a to 102d. The drivers 103a to 103d are connected to gates of the semiconductor switching elements 102a to 102d via gate wirings 210a to 210d, respectively, and connected to sources of the semiconductor switching elements 102a to 102d via source wirings 211a to 211d, respectively. The gate signals 110 from the control circuit 109 are input to the drivers 103a to 103d via isolation elements 110c to 110f, respectively. The semiconductor switching elements 102a to 102d may be semiconductor switching elements, each of which includes a diode connected in parallel between a source and a drain thereof, and is made of silicon carbide (SiC), a diamond-based material, or any material other than GaN.

Further, the driver 103a is provided with a control power supply (1) 111a and a control GND (1) 112a. The driver 103b is provided with a control power supply (2) 111b and a control GND (2) 112b. The driver 103c is provided with a control power supply (3) 111c and a control GND (3) 112c. Isolation is established between the control power supply (1) 111a and the control GND (1) 112a, between the control power supply (2) 111b and the control GND (2) 112b, and between the control power supply (3) 111c and the control GND (3) 112c.

Meanwhile, the driver 103d is configured to drive the semiconductor switching element 102d having a source on the same node as a source of the semiconductor switching element 102b, and is therefore provided with the same control power supply (2) 111b and the same control GND (2) 112b as those of the driver 103b.

Figure 2:
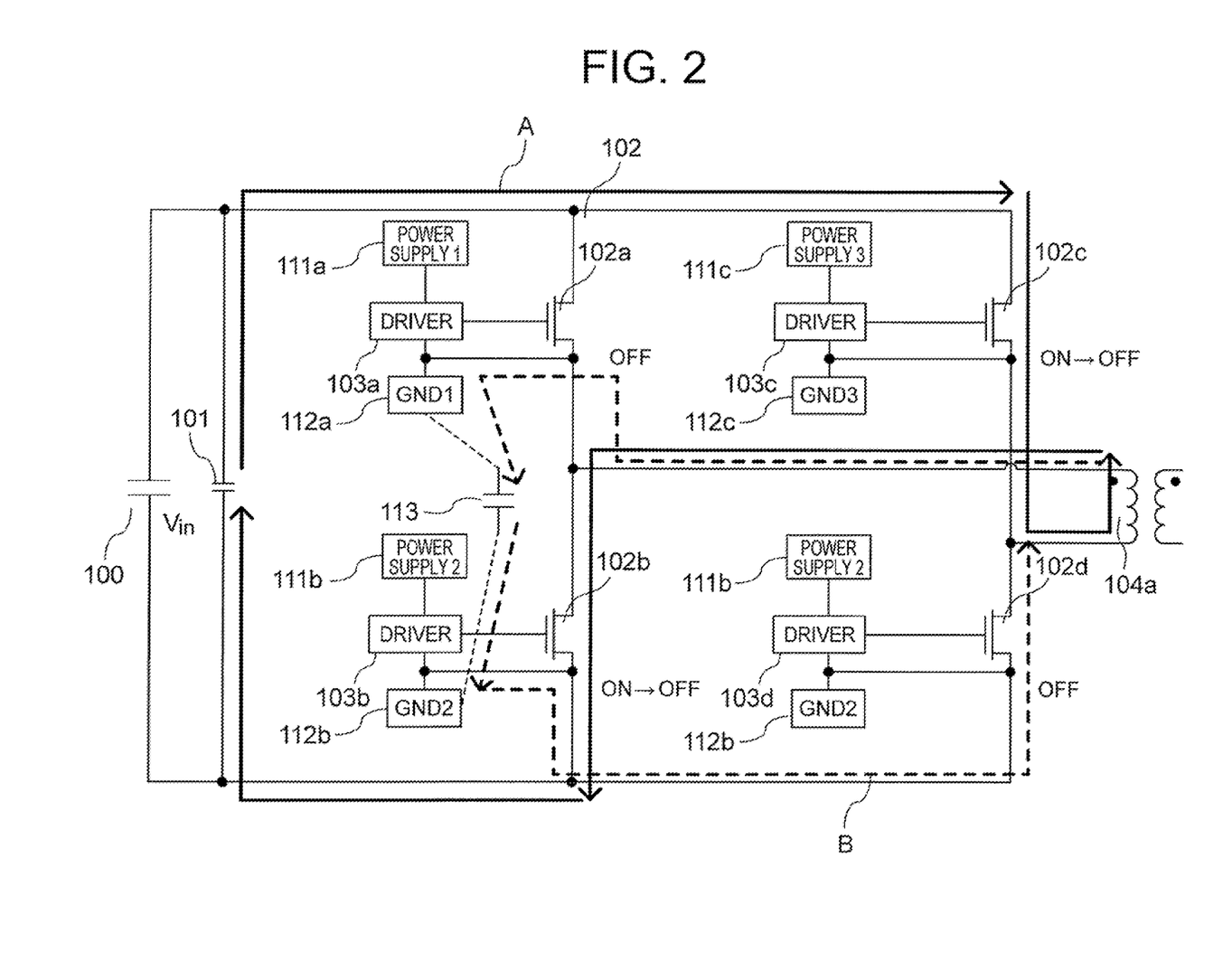
FIG. 2 is an explanatory diagram for illustrating a current path of a parasitic capacitor in the power conversion circuit according to the first embodiment of the present invention.
Figure 3:
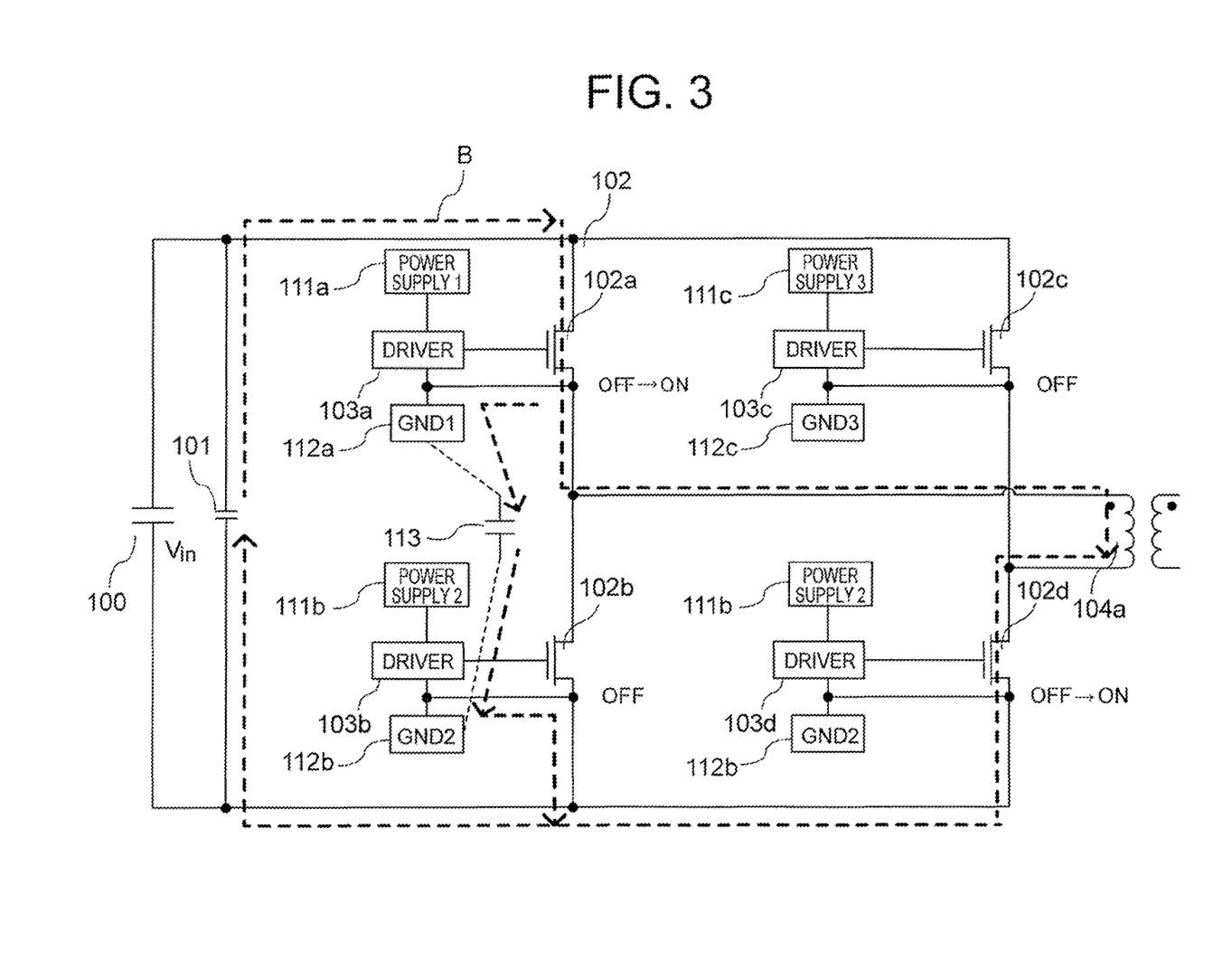
FIG. 3 is an explanatory diagram for illustrating a current path of a parasitic capacitor in the power conversion circuit according to the first embodiment of the present invention.
Figure 4:
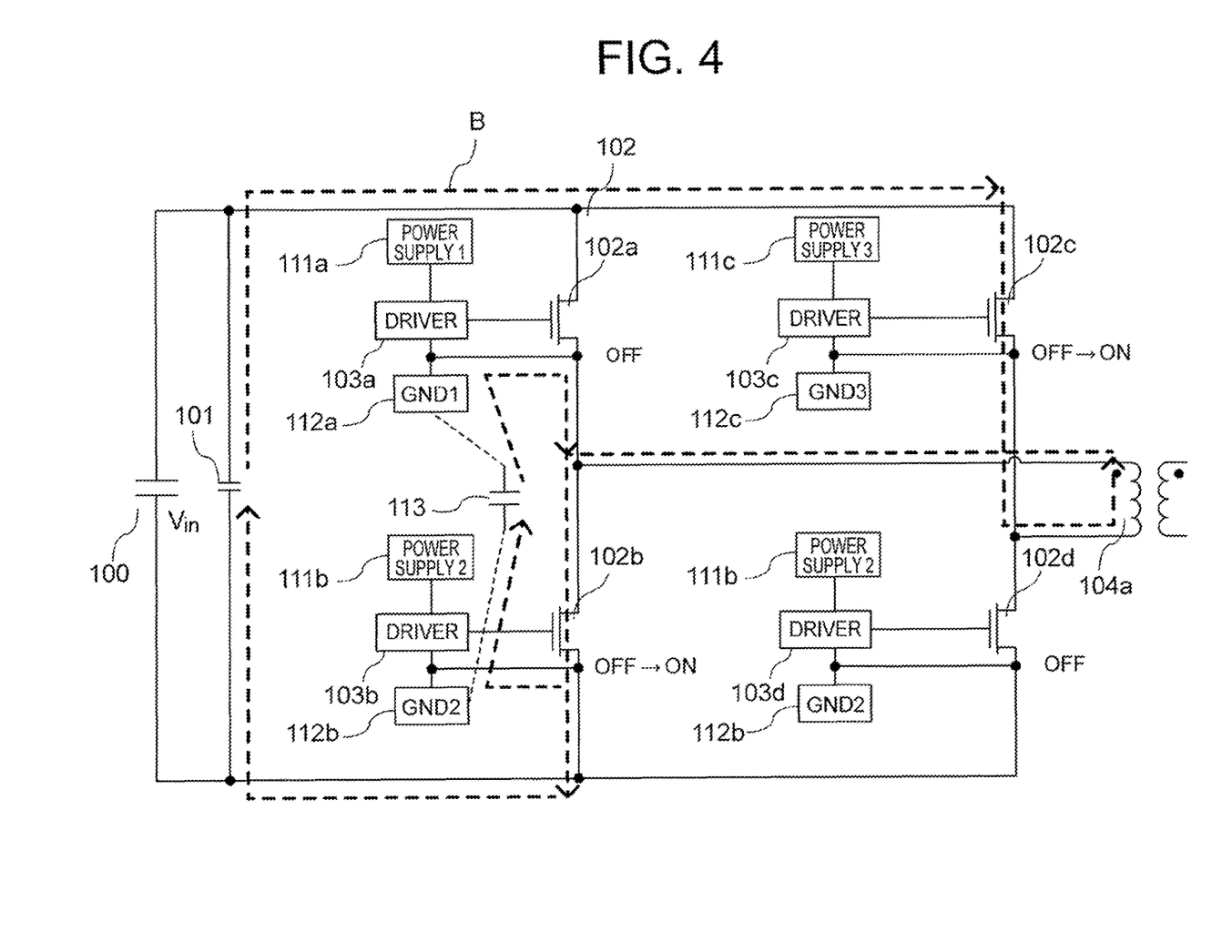
FIG. 4 is an explanatory diagram for illustrating a current path of a parasitic capacitor in the power conversion circuit according to the first embodiment of the present invention.

Next, referring to FIG. 2 to FIG. 4, a detailed description is given of an influence of any parasitic capacitor between control GNDs for different nodes in relation to a circuit operation of FIG. 1. The description is focused on an inter-pattern parasitic capacitor 113 between the control GNDs 112a and 112b for different nodes as an example.

FIG. 2 is a diagram for illustrating how an electric current flows when the semiconductor switching elements 102b and 102c are switched from an ON state to an OFF state in the single-phase inverter 102. In FIG. 2 to FIG. 6, the rectifier circuit 105 side is not illustrated. When the semiconductor switching elements 102b and 102c are in the ON state, the electric current flows in the direction indicated by the solid line A, that is, in the order of the input capacitor 101, the semiconductor switching element 102c, the primary winding 104a of the transformer, the semiconductor switching element 102b, and the input capacitor 101.

When the semiconductor switching elements 102b and 102c enter the OFF state, the electric current flows in the direction indicated by the dotted line B, that is, in the order of the transformer primary winding 104a, the control GND 112a, the inter-pattern parasitic capacitor 113, the control GND 112b, a drain-source parasitic capacitor of the semiconductor switching element 102d, and the transformer primary winding 104a. As a result, the inter-pattern parasitic capacitor 113 is charged. The charges thus accumulated in the inter-pattern parasitic capacitor 113 flow through the transformer primary winding 104a. This means that the larger inter-pattern parasitic capacitor 113 causes a larger amount of current to flow through the transformer primary winding 104a side, and consequently causes a large loss on the transformer primary winding 104a side.

To describe exactly, when the semiconductor switching elements 102b and 102c are switched off, the drain-source parasitic capacitors of the semiconductor switching elements 102a and 102d are discharged, and the drain-source parasitic capacitors of the semiconductor switching elements 102b and 102c are charged. However, those parasitic capacitors are small and thus are not illustrated.

FIG. 3 is a diagram for illustrating how an electric current flows when the four semiconductor switching elements 102a to 102d are first in an OFF state and then, the two semiconductor switching elements 102a and 102d enter an ON state. When the semiconductor switching elements 102a to 102d are in the OFF state, no electric current flows. When the semiconductor switching elements 102a and 102d enter the ON state, an electric current flows in the direction indicated by the dotted line B, that is, in the order of the input capacitor 101, the semiconductor switching element 102a, the primary winding 104a of the transformer 104, the semiconductor switching element 102d, and the input capacitor 101. To describe a current path of the parasitic capacitor, the electric current flows in the order of the input capacitor 101, the semiconductor switching element 102a, the control GND 112a, the inter-pattern parasitic capacitor 113, the control GND 112b, and the input capacitor 101. As a result, charges are accumulated in the inter-pattern parasitic capacitor 113. The charges thus accumulated flow through the semiconductor switching element 102a. This means that the larger inter-pattern parasitic capacitor 113 causes a larger amount of current to flow through the semiconductor switching element 102a, and consequently causes a large loss on the semiconductor switching element 102a.

To describe exactly, when the semiconductor switching elements 102a and 102d are switched on, the drain-source parasitic capacitors of the semiconductor switching elements 102a and 102d are discharged, and the drain-source parasitic capacitors of the semiconductor switching elements 102b and 102c are charged. However, those parasitic capacitors are small and thus are not illustrated.

FIG. 4 is a diagram for illustrating how an electric current flows when the four semiconductor switching elements 102a to 102d are first in an OFF state and then, the two semiconductor switching elements 102b and 102c enter an ON state. When the semiconductor switching elements 102a to 102d are in the OFF state, no electric current flows. When the semiconductor switching elements 102b and 102c enter the ON state, an electric current flows in the direction indicated by the dotted line B, that is, in the order of the input capacitor 101, the semiconductor switching element 102c, the primary winding 104a of the transformer 104, the semiconductor switching element 102b, and the input capacitor 101. To describe a current path of the parasitic capacitor, the electric current flows in the order of the inter-pattern parasitic capacitor 113, the control GND 112a, the semiconductor switching element 102b, the control GND 112b, and the inter-pattern parasitic capacitor 113. As a result, charges are released from the inter-pattern parasitic capacitor 113. The charges thus released flow through the semiconductor switching element 102b. This means that the larger inter-pattern parasitic capacitor 113 causes a larger amount of current to flow through the semiconductor switching element 102b, and consequently causes a large loss on the semiconductor switching element 102b.

To describe exactly, when the semiconductor switching elements 102b and 102c are switched on, the drain-source parasitic capacitors of the semiconductor switching elements 102a and 102d are charged, and the drain-source parasitic capacitors of the semiconductor switching elements 102b and 102c are discharged. However, those parasitic capacitors are small and thus are not illustrated.

In FIG. 2 to FIG. 4, the inter-pattern parasitic capacitor 113 between the control GNDs 112a and 112b for different nodes is illustrated by way of example. However, the same applies to an inter-pattern parasitic capacitor between the control GNDs 112c and 112b for different nodes.

Figure 5:
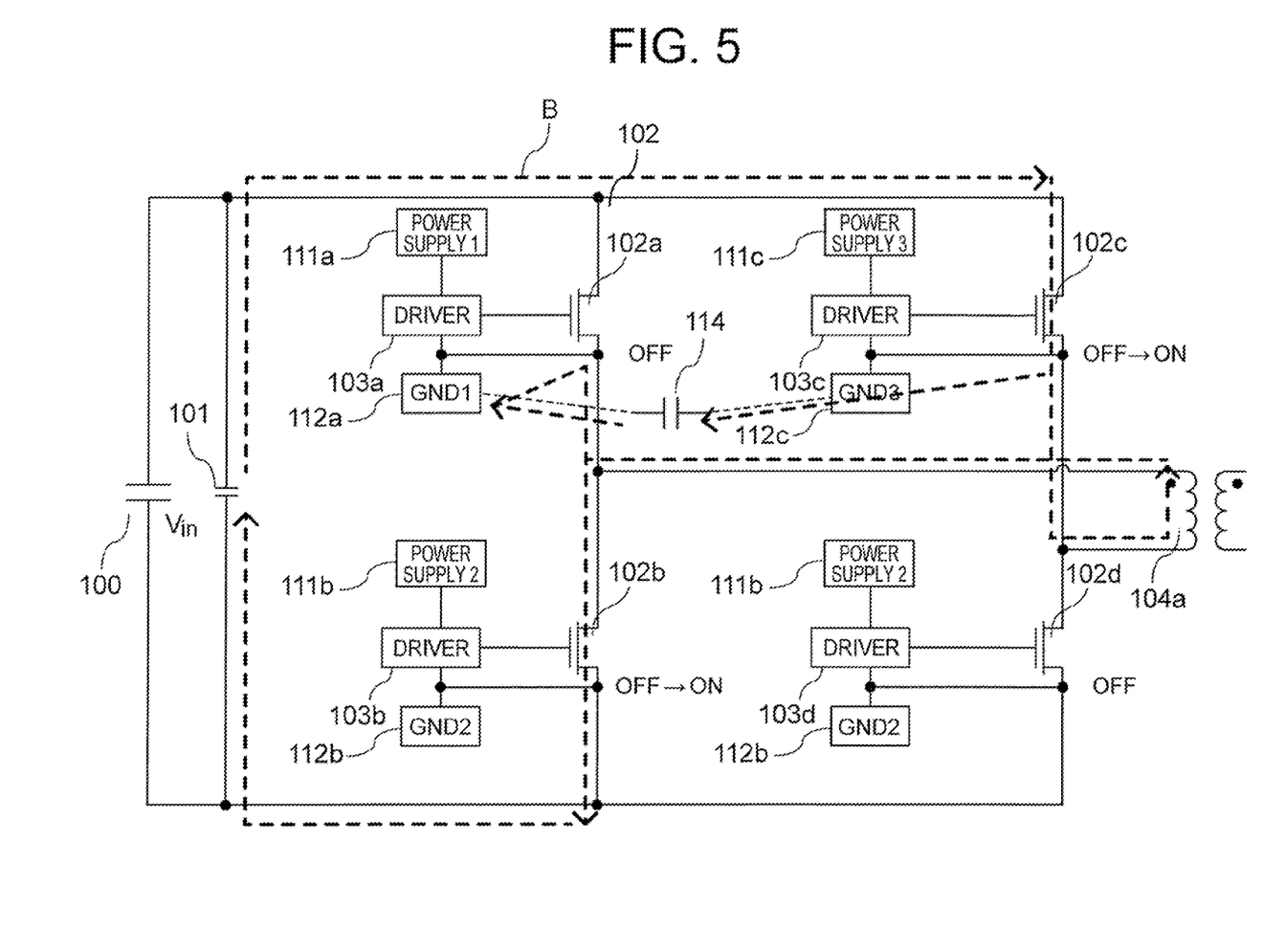
FIG. 5 is an explanatory diagram for illustrating a current path of a parasitic capacitor in the power conversion circuit according to the first embodiment of the present invention.
Figure 6:
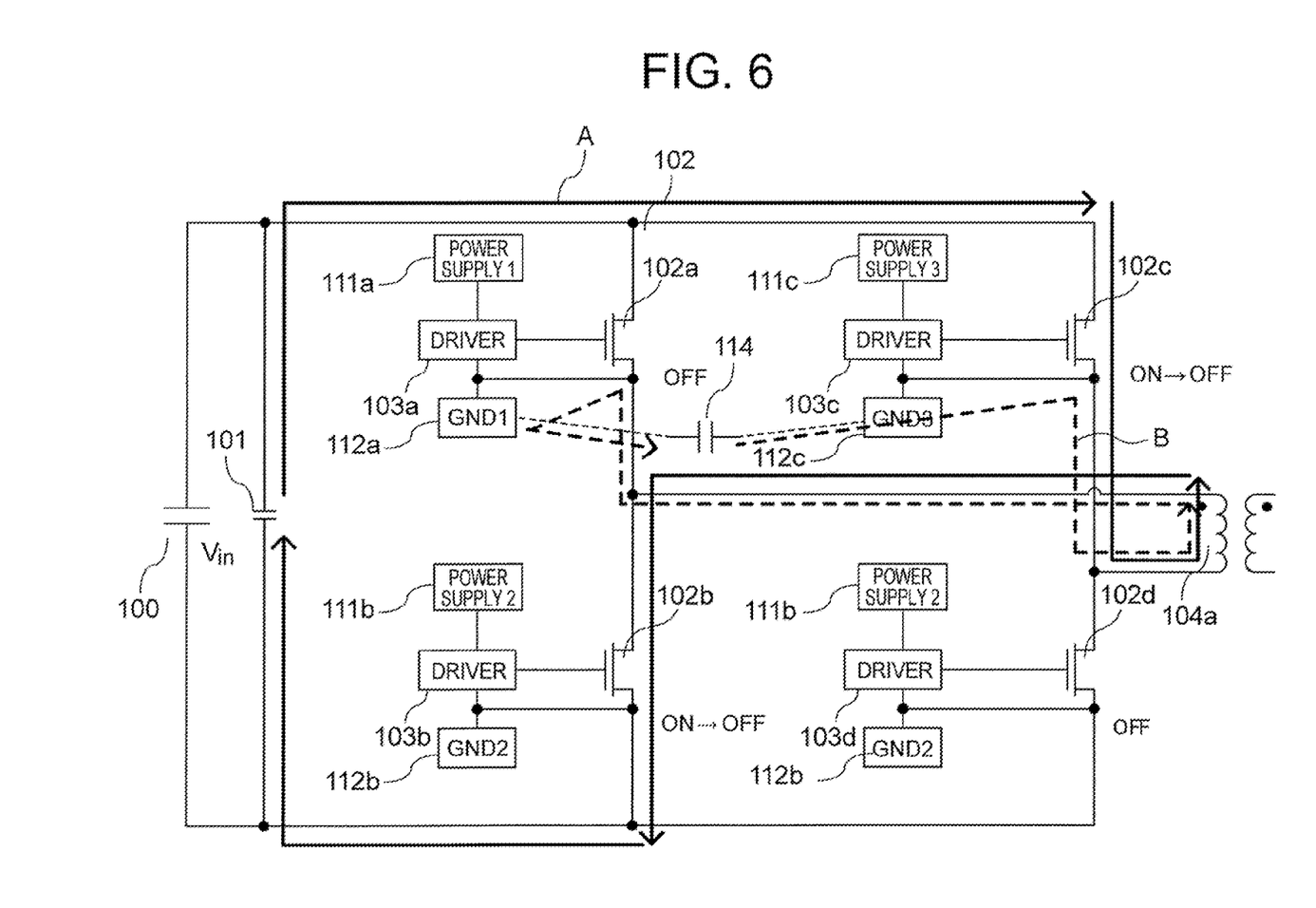
FIG. 6 is an explanatory diagram for illustrating a current path of a parasitic capacitor in the power conversion circuit according to the first embodiment of the present invention.

Next, referring to FIG. 5 and FIG. 6, a description is given of an influence of any parasitic capacitor between control GNDs for different nodes. Here, an inter-pattern parasitic capacitor 114 between the control GNDs 112a and 112c for different nodes is described. FIG. 5 is a diagram for illustrating how an electric current flows when the four semiconductor switching elements 102a to 102d are first in an OFF state and then, the semiconductor switching elements 102b and 102c enter an ON state. When the semiconductor switching elements 102a to 102d are in the OFF state, no electric current flows. When the semiconductor switching elements 102b and 102c enter the ON state, an electric current flows in the direction indicated by the dotted line B, that is, in the order of the input capacitor 101, the semiconductor switching element 102c, the primary winding 104a of the transformer 104, the semiconductor switching element 102b, and the input capacitor 101. To describe a current path of the parasitic capacitor, the electric current flows in the order of the input capacitor 101, the semiconductor switching element 102c, the control GND 112c, the inter-pattern parasitic capacitor 114, the control GND 112a, the semiconductor switching element 102b, and the input capacitor 101. As a result, the inter-pattern parasitic capacitor 114 is charged. The charges thus accumulated flow through the semiconductor switching elements 102b and 102c. This means that the larger inter-pattern parasitic capacitor 114 causes a larger amount of current to flow through the semiconductor switching elements 102b and 102c, and consequently causes a large loss on the semiconductor switching elements 102b and 102c.

FIG. 6 is a diagram for illustrating how an electric current flows when the semiconductor switching elements 102b and 102c are switched from an ON state to an OFF state. When the semiconductor switching elements 102b and 102c are in the ON state, the electric current flows in the direction indicated by the solid line A, that is, in the order of the input capacitor 101, the semiconductor switching element 102c, the primary winding 104a of the transformer 104, the semiconductor switching element 102b, and the input capacitor 101.

When the semiconductor switching elements 102b and 102c enter the OFF state, the electric current flows in the direction indicated by the dotted line B, that is, in the order of the inter-pattern parasitic capacitor 114, the transformer primary winding 104a, the control GND 112a, and the inter-pattern parasitic capacitor 114. As a result, the charges of the inter-pattern parasitic capacitor 114 are released.

The charges thus released flow through the transformer primary winding 104a. This means that the larger inter-pattern parasitic capacitor 114 causes a larger amount of current to flow through the transformer primary winding 104a, and consequently causes a large loss of the transformer primary winding 104a.

In the illustrated examples of FIG. 5 and FIG. 6, the semiconductor switching elements 102a to 102d are first in the OFF state and then, the semiconductor switching elements 102b and 102c enter the ON state and further the OFF state. Likewise, when the semiconductor switching elements 102a to 102d are first in an OFF state and then, the semiconductor switching elements 102a and 102d enter an ON state and further an OFF state, the inter-pattern parasitic capacitor 114 is charged/discharged as well.

Further, in any of the illustrated examples of FIG. 2 to FIG. 6, an electric current flows through each of the source wirings 211a to 211d (see FIG. 1) that connect the semiconductor switching elements 102a to 102d and the control GNDs of the drivers 103a to 103d, respectively, at a time of charging/discharging the inter-pattern parasitic capacitor 113 or the inter-pattern parasitic capacitor 114. In this case, a voltage drop occurs when the source wirings 211a to 211d have inductance. The voltage drop reflects on a gate voltage of each of the semiconductor switching elements 102a to 102d. There is a fear that the voltage drop leads to a noise on the gate voltage, and causes the semiconductor switching elements 102a to 102d to be unintentionally switched on or off, and eventually causes unstable operations thereof.

According to one embodiment of the present invention, it is possible to suppress an increase in loss of each of the semiconductor switching elements 102a to 102d, and the primary winding 104a of the transformer 104, and unstable operations of the semiconductor switching elements 102a to 102d, which may be caused by charging/discharging of the inter-pattern parasitic capacitor 113 or 114 as described above.

Figure 7:
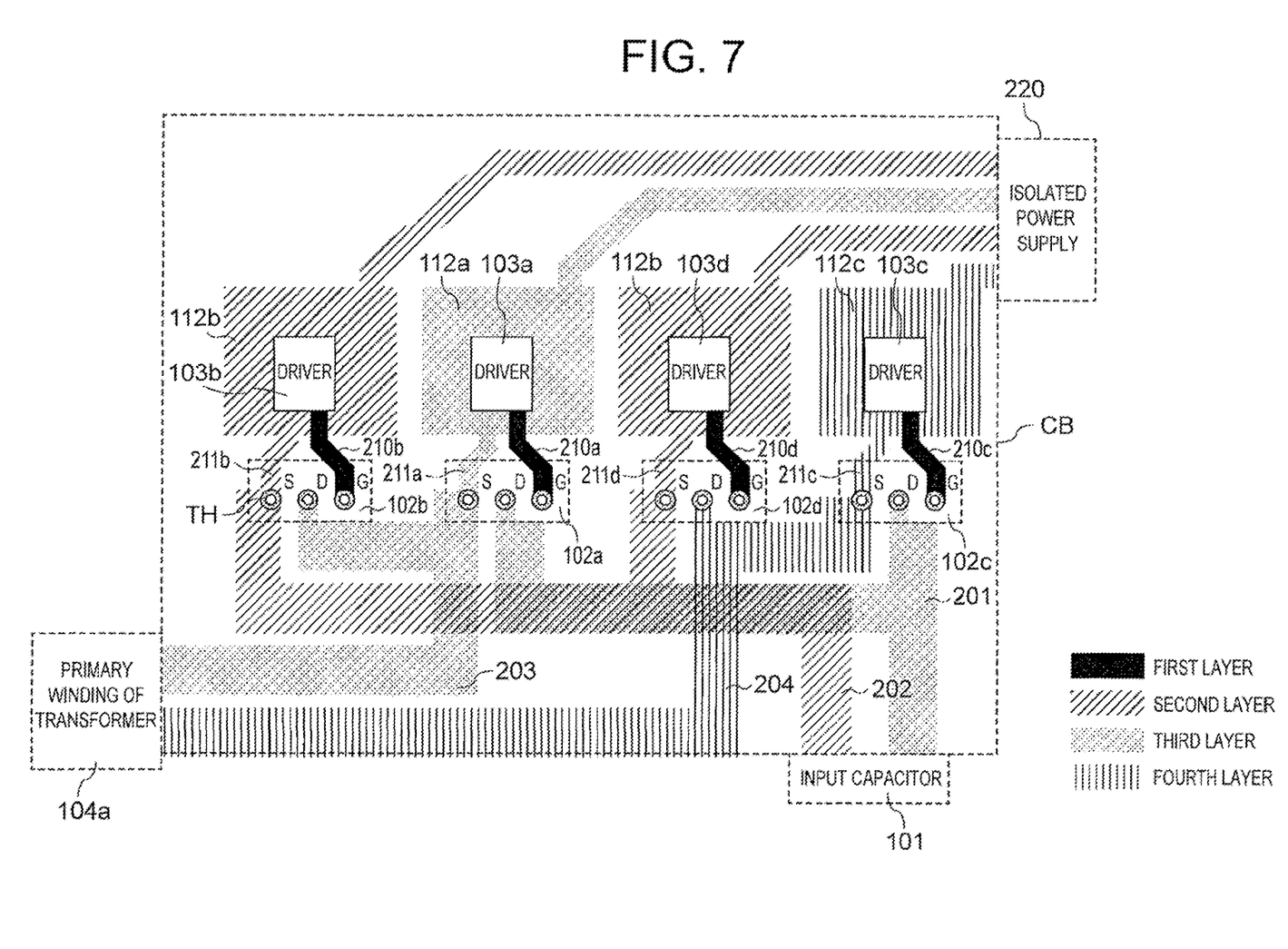
FIG. 7 is a view for illustrating an example of a circuit pattern configuration, in particular, control GND patterns of a circuit board of the power conversion circuit according to the first embodiment of the present invention.

Now, a description is given of a circuit board configuration of the power conversion circuit for the power conversion device according to the first embodiment of the present invention. FIG. 7 is a view for illustrating an example of the circuit board configuration of the power conversion circuit according to the first embodiment of the present invention. The following description is made of circuit board patterns for the plurality of control GNDs 112a to 112c for different nodes used to drive the semiconductor switching elements.

FIG. 7 is a view for illustrating an example of patterns for the semiconductor switching elements 102a to 102d as components of the circuit of FIG. 1, the drivers 103a to 103d for driving the semiconductor switching elements 102a to 102d, respectively, and the control GNDs 112a, 112b, and 112c to be connected to the drivers 103a to 103d, respectively. Identical or equivalent components to those of FIG. 1 are denoted by the same reference symbols.

In FIG. 7 to FIG. 11, circuit patterns for the control power supplies 111a to 111c are illustrated as control power supply patterns 111a to 111c, respectively, and circuit patterns for the control GNDs 112a to 112c are illustrated as control GND patterns 112a to 112c, respectively. Further, circuit patterns of first to fourth layers are illustrated as a solid pattern, a hatched pattern, a dot pattern, and a stripe pattern, respectively.

A circuit board CB having a plurality of layers including at least two or more layers, which is made of glass epoxy as a base material, has through-holes TH through which to mount the semiconductor switching elements 102a to 102d. In this example, the semiconductor switching elements 102a to 102d are inserted components having three lead terminals, that is, a drain (D), a gate (G), and a source (S).

The drain terminal D of the semiconductor switching element 102a and the drain terminal D of the semiconductor switching element 102c are connected to a positive electrode of the input capacitor 101 via a circuit board pattern 201 in the third layer. The source terminal S of the semiconductor switching element 102b and the source terminal S of the semiconductor switching element 102d are connected to a negative electrode of the input capacitor 101 via a circuit board pattern 202 in the second layer.

Further, the source terminal S of the semiconductor switching element 102a and the drain terminal D of the semiconductor switching element 102b are connected to a first terminal of the transformer on the primary winding 104a side via a circuit board pattern 203 in the third layer. Further, the source terminal S of the semiconductor switching element 102c and the drain terminal D of the semiconductor switching element 102d are connected to a second terminal of the transformer on the primary winding 104a side via a circuit board pattern 204 in the fourth layer.

The gates G of the semiconductor switching elements 102a to 102d are connected to the drivers 103a to 103d via gate wirings 210a to 210d as circuit board patterns, respectively. Further, the sources S of the semiconductor switching elements 102a to 102d are connected to the drivers 103a to 103d via the source wirings 211a to 211d as circuit board patterns, respectively.

The isolated control GND patterns 112a to 112c are provided in the form of a solid pattern around the drivers 103a to 103d. The control GND patterns 112a to 112c are arranged so as not to overlap one another as seen in plan view from a stacking direction of the layers of the circuit board CB. The stacking direction of the layers of the circuit board CB refers to a direction orthogonal to the sheet of FIG. 7. The control GND patterns 112a to 112c are connected to an isolated power supply 220 without overlapping one another. GND terminals (not shown) of the drivers 103a to 103d are connected to the control GND patterns 112a to 112c through vias, for example.

By thus arranging the control GND patterns 112a to 112c for different nodes so as not to overlap one another as seen in plan view from the stacking direction of the layers, the inter-pattern parasitic capacitors between the control GND 112a and the control GND 112b, between the control GND 112c and the control GND 112b, and between the control GND 112a and the control GND 112c can be reduced. With this configuration, it is possible to suppress an increase in loss of each of the semiconductor switching elements 102a to 102d and the primary winding 104a of the transformer, which may occur due to charging/discharging of any inter-pattern parasitic capacitor during switching operations of the semiconductor switching elements 102a to 102d. It is also possible to reduce an electric current that flows through the source wirings 211a to 211d due to charging/discharging of any inter-pattern parasitic capacitor during the switching operations of the semiconductor switching elements 102a to 102d. This configuration can prevent such a situation that noise is superimposed on the gates of the semiconductor switching elements 102a to 102d, to thereby cause the respective elements to operate unstably, and thus can ensure stable operations of the semiconductor switching elements 102a to 102d.

Figure 8:
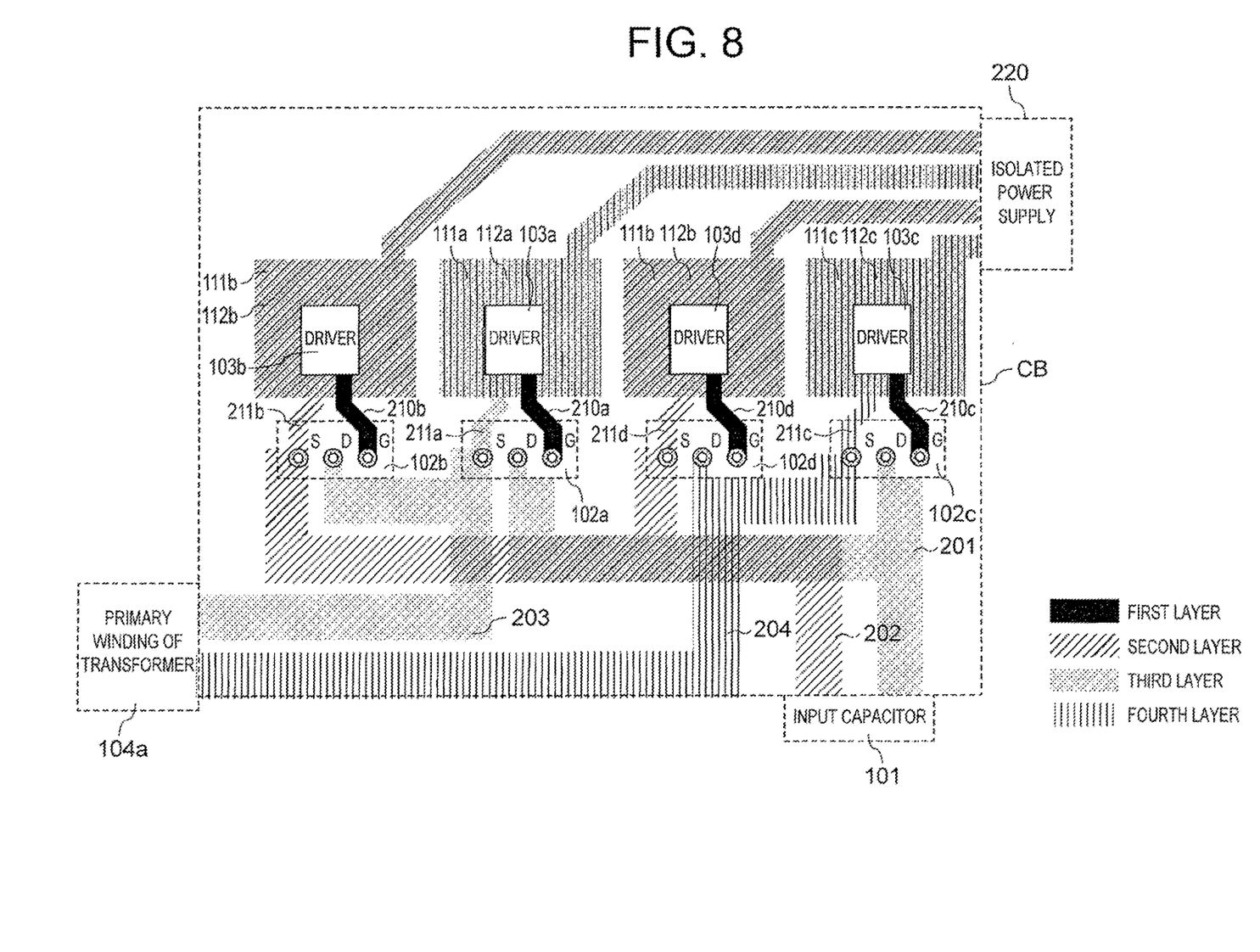
FIG. 8 is a view for illustrating another example of the circuit pattern configuration, in particular, control GND patterns and control power supply patterns of the circuit board of the power conversion circuit according to the first embodiment of the present invention.

The isolated power supply 220 serves as the control power supplies 111a to 111c of FIG. 1, which are configured to drive the drivers 103a to 103d corresponding to the control GND patterns 112a to 112c. As illustrated in FIG. 8, the control power supply patterns 111a to 111c are wired so as to overlap the corresponding control GND patterns 112a to 112c, respectively, in different layers in the stacking direction of the layers of the circuit board CB. By thus wiring the control GND patterns 112a to 112c and the control power supply patterns 111a to 111c, inter-pattern parasitic capacitors are formed between those wiring pairs, to thereby achieve a more stable power supply.

In FIG. 7, the control GND pattern 112a is formed in the third layer, the two control GND patterns 112b on both sides of the control GND pattern 112a are formed in the second layer, and the control GND pattern 112c on the right side is formed in the fourth layer.

FIG. 8 is a view for illustrating an example in which the control GND patterns of FIG. 7 are provided while being overlapped with suitable control power supply patterns. The control power supply pattern 111a is formed in the fourth layer (illustrated in a stripe pattern), the control power supply patterns 111b are formed in the third layer (illustrated in a dot pattern), and the control power supply pattern 111c is formed in the third layer (illustrated in the dot pattern). Those patterns overlap the control GND patterns of FIG. 7.

The way to assign the wirings to the layers of the circuit board in the first embodiment is merely an example, and the present invention is not limited to the examples of FIG. 7 and FIG. 8. Further, the arrangement of the semiconductor switching elements 102a to 102d is merely an example, and the present invention is not limited to the examples above. Furthermore, in the example described in the first embodiment, the circuit board is a four-layer circuit board, but the number of layers is not limited thereto, and the circuit board may have six or more layers, for example.

In the example described in the first embodiment, the semiconductor switching elements 102a to 102d are directly connected to the corresponding drivers 103a to 103d, respectively, but the semiconductor switching elements 102a to 102d can be connected to the corresponding drivers 103a to 103d, respectively, via resistors, capacitors, ferrite beads, or other such elements (not shown) interposed therebetween.

Second Embodiment

Now, a second embodiment of the present invention is described.

Figure 9:
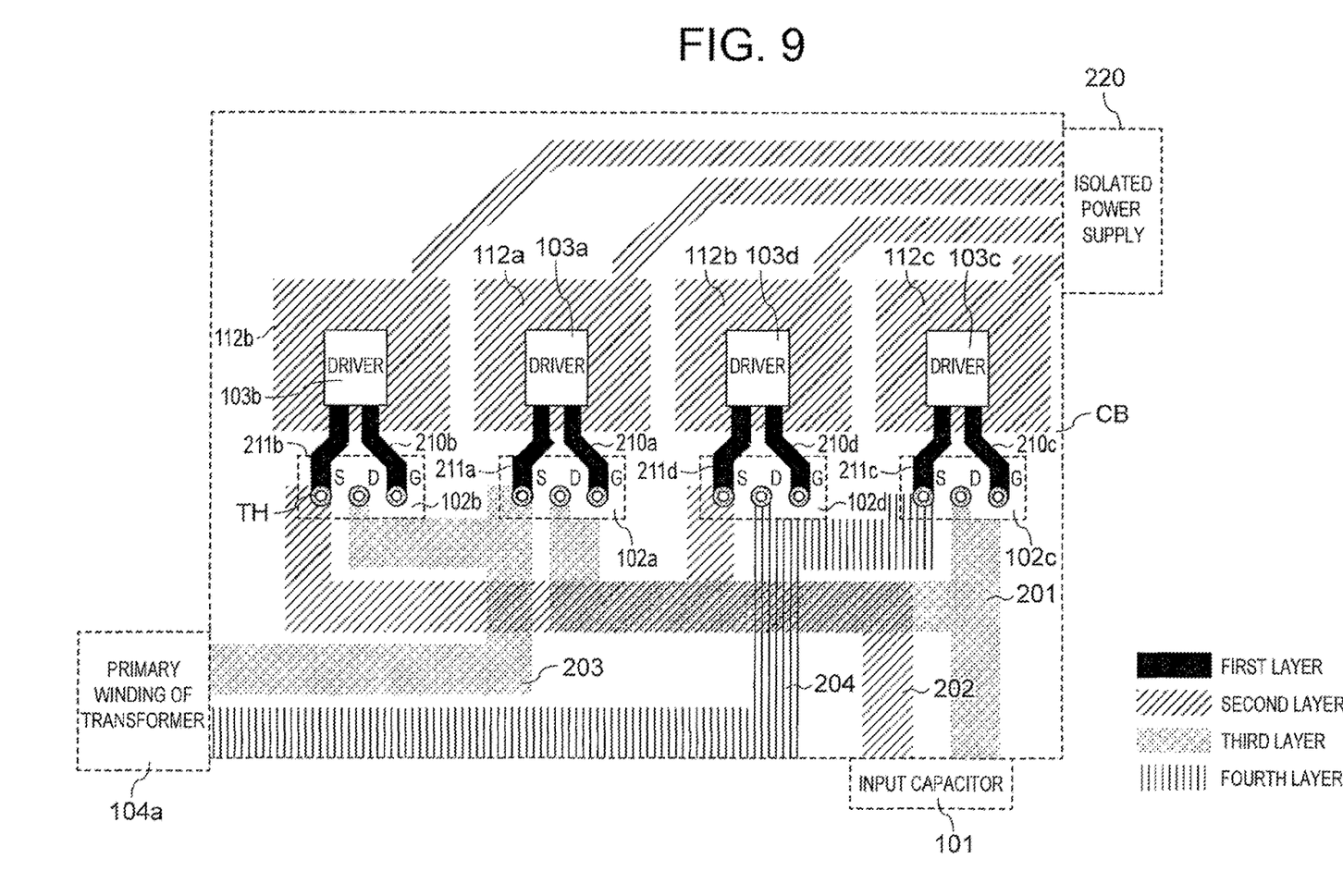
FIG. 9 is a view for illustrating an example of a circuit pattern configuration, in particular, control GND patterns of a circuit board of a power conversion circuit according to a second embodiment of the present invention.
Figure 10:
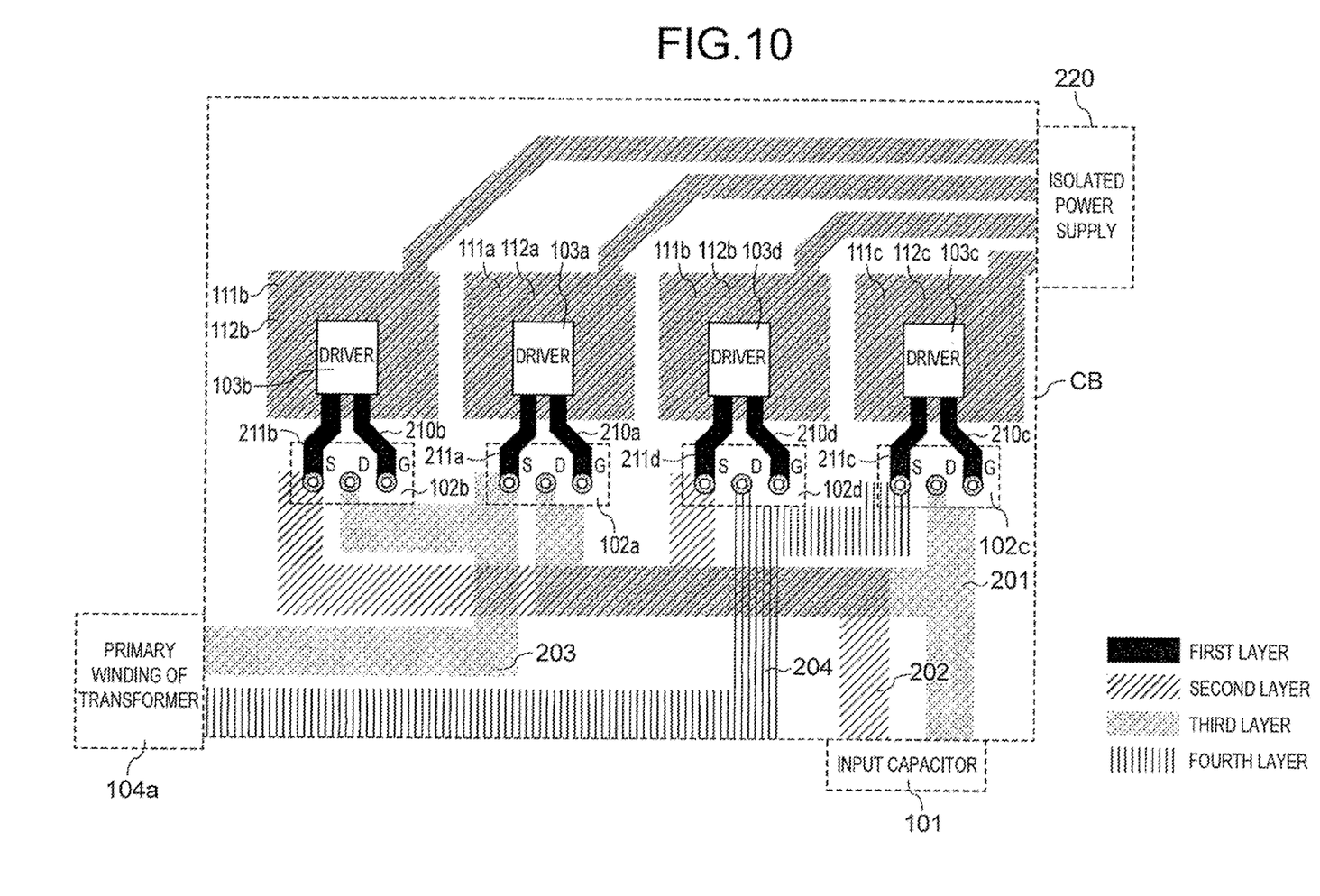
FIG. 10 is a view for illustrating another example of the circuit pattern configuration, in particular, control GND patterns and control power supply patterns of the circuit board of the power conversion circuit according to the second embodiment of the present invention.

In the example described in the first embodiment, the isolated GNDs for different nodes, that is, the control power supply patterns are arranged so as not to overlap one another as seen in plan view from the stacking direction of the layers. In contrast, in the second embodiment, there is described an example in which the isolated GNDs for different nodes are wired in different positions in the same layer of the circuit board. Referring to FIG. 9 and FIG. 10, a pattern arrangement example in the second embodiment is described in detail. Here, components of FIG. 9 and FIG. 10, which are the same as those of FIG. 7 and FIG. 8, are denoted by the same reference symbols. The following description is focused on the differences from the configuration of FIG. 7 and FIG. 8. A circuit configuration adopted herein is the same as that of FIG. 1.

In the first embodiment, the source wirings 211a to 211d and the circuit board patterns 202 and 204 that form power wirings to be connected to the source wirings are provided in the same layer. Further, the source wirings 211a to 211d and the control GND patterns 112a to 112c to be connected to the source wirings 211a to 211d are provided in the same layer. In the second embodiment, as illustrated in FIG. 9, the source wirings 211a to 211d are all arranged in the same layer, for example, in the first layer. Further, the control GND patterns 112a to 112c are arranged in different positions in the same layer, for example, in the second layer. Here, GND terminals (not shown) of the drivers 103a to 103d are connected to the control GND patterns 112a to 112c through vias, for example.

By thus arranging the control GND patterns 112a to 112c for different nodes in the same layer of the circuit board, the inter-pattern parasitic capacitors between the control GND 112a and the control GND 112b, between the control GND 112c and the control GND 112b, and between the control GND 112a and the control GND 112c can be all reduced. It is accordingly possible to suppress an increase in loss of each of the semiconductor switching elements 102a to 102d and the primary winding 104a of the transformer, which may occur due to charging/discharging of any inter-pattern parasitic capacitor during the switching operations of the semiconductor switching elements 102a to 102d. Further, it is also possible to reduce an electric current that flows through the source wirings 211a to 211d due to charging/discharging of any inter-pattern parasitic capacitor during the switching operations of the semiconductor switching elements 102a to 102d. This configuration can prevent such a situation that noise is superimposed on the gates of, to thereby cause the elements to operate unstably, and thus can ensure stable operations of the semiconductor switching elements 102a to 102d.

The isolated power supply 220 serves as the control power supplies 111a to 111c of FIG. 1, which are configured to drive the drivers 103a to 103d corresponding to the control GND patterns 112a to 112c. As illustrated in FIG. 10, the control power supply patterns 111a to 111c are wired to the corresponding control GND patterns 112a to 112c, respectively, in a different layer therefrom, and are also arranged in different positions in the same layer, for example, in the third layer.

As described above, in the wiring patterns adopted in the second embodiment, the control GND patterns 112a to 112c are arranged in different positions in the same layer, and the control power supply patterns 111a to 111c are arranged in different positions in the same layer. Such wiring patterns ensure an effect of reducing the inter-pattern parasitic capacitors and further, allow efficient use of a limited region of the circuit board to design circuit patterns. Hence, arrangement design of sensors or other such elements, or wirings can be made with ease, and the power conversion circuit board and the power conversion device can be downsized. Further, as an alternative, a wiring pattern in which the control power supply patterns 111a to 111c are arranged so as to overlap the corresponding control GND patterns 112a to 112c, respectively, in the stacking direction of the layers of the circuit board CB may be adopted. By thus wiring the control GND patterns 112a to 112c and the control power supply patterns 111a to 111c, inter-pattern parasitic capacitors are formed between those wiring pairs, to thereby achieve a more stable power supply.

Figure 11:
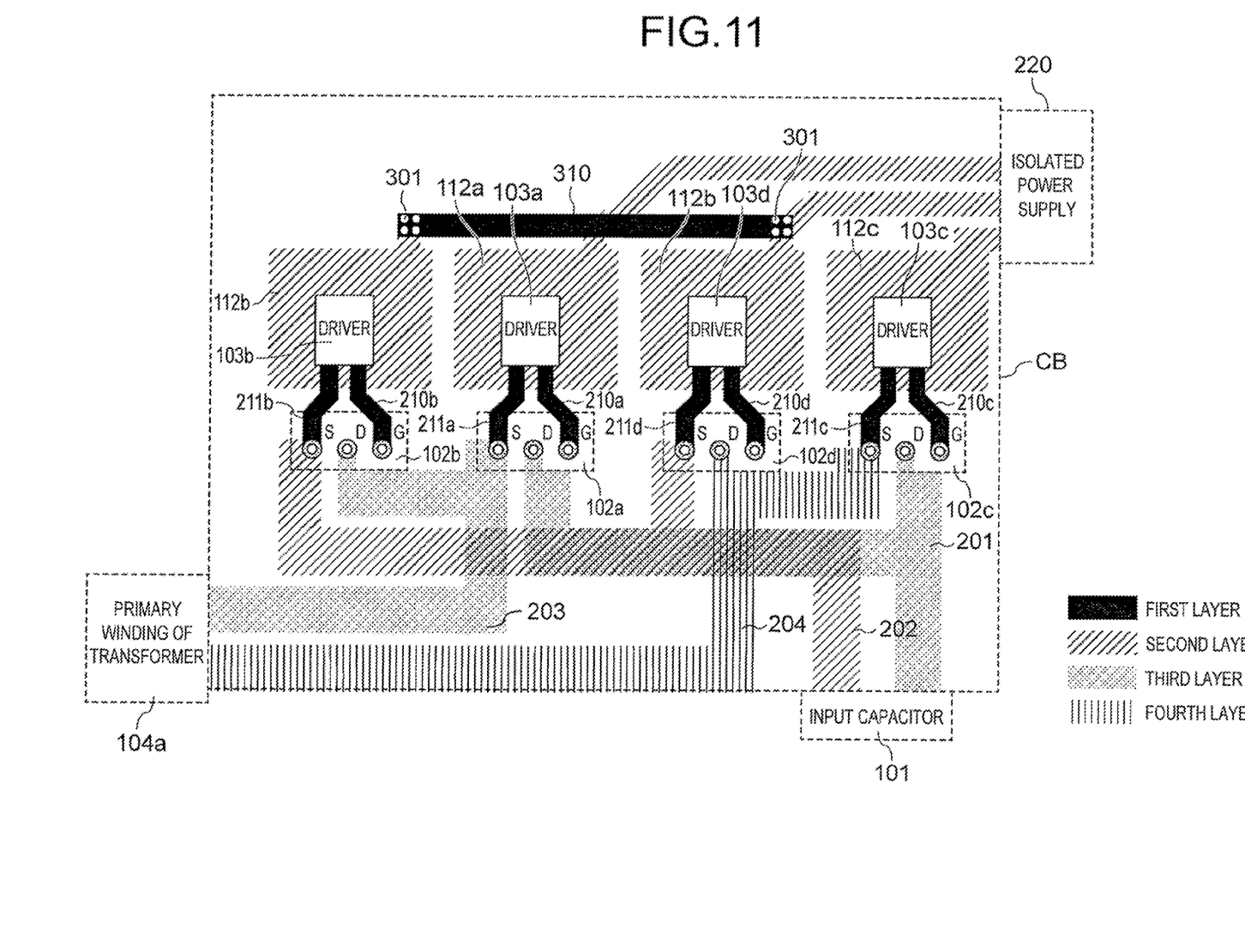
FIG. 11 is a view for illustrating still another example of the circuit pattern configuration, in particular, control GND patterns of the circuit board of the power conversion circuit according to the second embodiment of the present invention.

In the illustrated example of FIG. 9, the control GND patterns 112a to 112c are all arranged in the same layer, but the present invention is not limited thereto. Some of the control GND patterns 112a to 112c may be formed in another wiring layer. In FIG. 11, the two control GND patterns 112b, 112b for the same node lie on each side of the control GND pattern 112a as a wiring for another node. Then, the two control GND patterns 112b, 112b thus physically separated from each other are connected to each other, for example, via a first layer wiring 310 and interlayer connection vias 301 formed at both ends of the first layer wiring 310.

When some of the control GND patterns 112a to 112c in the same layer are for the same node but are physically separated from one another across any wiring for another node, those patterns are connected to each other via a wiring in another layer, with the result that the number of wirings to be connected to the isolated power supply 220 can be reduced. With this configuration, the power conversion circuit board can be downsized and consequently, the power conversion circuit and the power conversion device can be downsized.

The way to assign the wirings to the layers of the circuit board in the second embodiment is merely an example, and the present invention is not limited thereto. The arrangement of the semiconductor switching elements 102a to 102d is also merely an example, and the present invention is not limited thereto. Further, in the example described in the second embodiment, the circuit board is a four-layer circuit board, but the number of layers is not limited thereto, and the circuit board may have six or more layers, for example. Meanwhile, regarding two semiconductor switching elements that form one half-bridge circuit, it is also possible to achieve the power conversion circuit of the present invention with use of a two-layer circuit board.

Regarding a power conversion circuit designed for use with a high voltage, the control GND patterns (112a to 112c) are isolated from a housing of the power conversion circuit or the power conversion device. Further, in FIG. 7 to FIG. 11, the isolated power supply 220, the primary winding 104a of the transformer, and the input capacitor 101 are provided outside the circuit board CB. However, those components may be mounted on the surface of the circuit board CB or in the circuit board CB together with the semiconductor switching elements 102a to 102d and the drivers 103a to 103d.

According to one embodiment of the present invention, the circuit patterns of the circuit board for the plurality of GNDs for different nodes, which are used to drive the wide-bandgap semiconductor switching elements, are arranged so as not to overlap one another in plan view of the circuit board. Specifically, the circuit patterns of the circuit board for the plurality of GNDs for different nodes are arranged in positions not overlapping each other in the stacking direction of the layers of the circuit board, or in different positions in the same layer. With this configuration, it is possible to reduce the parasitic capacitors between the GNDs for different nodes, and reduce a loss of each semiconductor switching element during a high-frequency switching operation, and consequently to improve an efficiency of the power conversion circuit, and reduce a size and cost of the power conversion circuit by simplifying a cooling structure for each semiconductor switching element. Further, it is also possible to reduce an electric current flowing through a parasitic inductance portion of a GND wiring between a driver and a semiconductor switching element during a high-speed switching operation, and consequently to achieve a stable high-speed switching operation.

REFERENCE SIGNS LIST 100 input power supply, 101 input capacitor, 102 single-phase inverter (power converter), 102a-102d semiconductor switching element, 103a-103d driver, 104 transformer, 104a primary winding, 104b secondary winding, 105 rectifier circuit, 105a-105d diode, 106 reactor, 107 output capacitor, 108 load, 109 control circuit, 110a-110f isolation element, 111a-111c control power supply (control power supply pattern), 112a-112c control GND (control GND (ground) pattern), 113, 114 inter-pattern parasitic capacitor, 201-204 circuit board pattern (wiring), 210a gate wiring, 211a source wiring, 220 isolated power supply, 310 first layer wiring, CB circuit board

The invention claimed is:
1. A power conversion circuit, comprising:
 a circuit board including a plurality of layers including two or more layers, on which circuit patterns are formed, said layers being stacked in an orthogonal direction; and
 a plurality of semiconductor switching elements, which are connected to the circuit patterns of the circuit board, and are configured to perform switching for power conversion,
 wherein, in the circuit board, a plurality of control ground patterns for different nodes, which are configured to drive the plurality of semiconductor switching elements, are arranged so as not to overlap one another in plan view.
2. The power conversion circuit according to claim 1, wherein the plurality of semiconductor switching elements are each formed of a wide-bandgap semiconductor.
3. The power conversion circuit according to claim 1, further comprising:
 at least one half-bridge circuit including the plurality of semiconductor switching elements;
 a first control ground pattern, which is connected to a source of a first semiconductor switching element that forms the at least one half-bridge circuit, and is connected to a ground of a driver configured to drive the first semiconductor switching element; and
 a second control ground pattern, which is connected to a source of a second semiconductor switching element that forms the at least one half-bridge circuit, the source being different from the source of the first semiconductor switching element, and is connected to a ground of a driver configured to drive the second semiconductor switching element, wherein the first control ground pattern and the second control ground pattern are provided in positions not overlapping each other in a stacking direction of the plurality of layers of the circuit board.

4. The power conversion circuit according to claim 1, further comprising:
   at least one half-bridge circuit including the plurality of semiconductor switching elements;
   a first control ground pattern, which is connected to a source of a first semiconductor switching element that forms the at least one half-bridge circuit, and is connected to a ground of a driver configured to drive the first semiconductor switching element; and
   a second control ground pattern, which is connected to a source of a second semiconductor switching element that forms the at least one half-bridge circuit, the source being different from the source of the first semiconductor switching element, and is connected to a ground of a driver configured to drive the second semiconductor switching element,
   wherein the first control ground pattern and the second control ground pattern are provided in different positions in the same layer of the circuit board.

5. The power conversion circuit according to claim 3, wherein a first control power supply pattern using the first control ground pattern as a reference and a second control power supply pattern using the second control ground pattern as a reference are arranged in different positions in the same layer of the circuit board.

6. The power conversion circuit according to claim 3, wherein the first control ground pattern and the second control ground pattern are isolated from a housing of the power conversion circuit.

7. The power conversion circuit according to claim 5, wherein the first control ground pattern and the first control power supply pattern are provided in positions overlapping each other in the stacking direction of the plurality of layers of the circuit board, and the second control ground pattern and the second control power supply pattern are provided in positions overlapping each other in the stacking direction of the plurality of layers of the circuit board.

8. The power conversion circuit according to claim 3, wherein the first semiconductor switching element and the second semiconductor switching element are semiconductor switching elements of an upper arm and a lower arm, which form one half-bridge circuit.

9. The power conversion circuit according to claim 3,
   wherein the power conversion circuit includes a plurality of the half-bridge circuits, and
   wherein the first semiconductor switching element and the second semiconductor switching element are semiconductor switching elements of upper arms of different half-bridge circuits.

10. The power conversion circuit according to claim 1,
    wherein the plurality of semiconductor switching elements are semiconductor switching elements made of GaN.

* * * * *